(12) United States Patent
Bhattacharya et al.

(10) Patent No.: US 8,259,460 B2
(45) Date of Patent: Sep. 4, 2012

(54) SUBMOUNT FOR ELECTRONIC COMPONENTS

(75) Inventors: Rabin Bhattacharya, Eindhoven (NL);
Pieter Jacob Snijder, Eindhoven (NL);
Liesbeth Van Pieterson, Eindhoven (NL); Erich Zainzinger, Hong Kong (HK); Martijn Krans, Eindhoven (NL);
Sima Asvadi, Eindhoven (NL);
Alexander Ulrich Douglas, Eindhoven (NL); Jacqueline Van Driel, Eindhoven (NL); Martinus Jacobus Johannes Hack, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 336 days.

(21) Appl. No.: 12/303,572

(22) PCT Filed: Jun. 5, 2007

(86) PCT No.: PCT/IB2007/052096
§ 371 (c)(1),
(2), (4) Date: May 24, 2010

(87) PCT Pub. No.: WO2008/007237
PCT Pub. Date: Jan. 17, 2008

(65) Prior Publication Data
US 2010/0238637 A1    Sep. 23, 2010

(30) Foreign Application Priority Data

Jun. 8, 2006  (EP) .................................... 06115109
Dec. 19, 2006 (EP) .................................... 06126499

(51) Int. Cl.
*H05K 7/02*  (2006.01)
*H05K 1/16*  (2006.01)
*H05K 3/00*  (2006.01)

(52) U.S. Cl. .......... 361/760; 361/761; 361/767; 439/37; 439/69; 439/82; 174/260

(58) Field of Classification Search ................. 361/732, 361/737, 752, 760–767, 784–798, 805, 807; 362/103, 104, 108, 234, 249; 439/37, 62, 439/68, 69, 81, 82, 83, 153, 179, 260, 325, 439/444, 248, 500, 620, 698, 855, 886; 174/138 G; 200/52 R, 511
See application file for complete search history.

(56) References Cited

U.S. PATENT DOCUMENTS 2,802,188 A * 8/1957 Badders ....................... 439/325
(Continued)

FOREIGN PATENT DOCUMENTS

FR      2497985 B     7/1982
(Continued)

OTHER PUBLICATIONS

Robert F. Services: Electronic Textiles Charge Ahead, Science, vol. 301, Aug. 15, 2003, pp. 909-911.

(Continued)

*Primary Examiner* — Michail V Datskovskiy

(57) ABSTRACT

A submount for arranging electronic components on a substrate is provided. The submount comprises a head member and at least one substrate-engaging member protruding from the head member. The head member comprises at least two, from each other isolated, electrically conductive portions, where each electrically conductive portion comprises a component contact, adapted for connection of electronic components thereto, and a substrate contact on arranged on said substrate side, adapted for bringing said electrically conductive portions in contact with a circuitry comprised in said substrate. The submount of the present invention may be used to attach electronic components, such as light-emitting diodes, to a textile substrate, without the need for soldering the electronic component directly on the substrate.

23 Claims, 4 Drawing Sheets

U.S. PATENT DOCUMENTS

| | | | |
|---|---|---|---|
| 3,634,601 A | | 1/1972 | Pauza |
| 3,813,637 A | * | 5/1974 | Grebik et al. ................ 439/586 |
| 3,980,376 A | * | 9/1976 | Rosen ........................... 439/327 |
| 4,060,296 A | * | 11/1977 | Kunkle et al. .................... 439/70 |
| 4,076,976 A | * | 2/1978 | Fenton .......................... 362/104 |
| 4,089,041 A | * | 5/1978 | Lockard ........................ 361/767 |
| 4,129,351 A | * | 12/1978 | Sugimoto et al. ............. 439/325 |
| 4,308,572 A | | 12/1981 | Davidson et al. |
| 4,327,955 A | * | 5/1982 | Minter .......................... 439/260 |
| 4,480,293 A | | 10/1984 | Wells |
| 4,631,639 A | | 12/1986 | Biraud |
| 4,681,392 A | * | 7/1987 | Terita ............................ 439/751 |
| 4,762,497 A | * | 8/1988 | Burvee .......................... 439/37 |
| 4,823,240 A | | 4/1989 | Shenker |
| 4,828,503 A | * | 5/1989 | Gilissen et al. ................. 439/62 |
| 4,882,865 A | | 11/1989 | Andeweg |
| 5,062,818 A | | 11/1991 | Wasimoto et al. |
| 5,073,119 A | * | 12/1991 | Soes ............................. 439/82 |
| 5,201,663 A | * | 4/1993 | Kikuchi et al. ................. 439/83 |
| 5,273,446 A | * | 12/1993 | Walkup ......................... 439/153 |
| 5,278,734 A | | 1/1994 | Ferber |
| 5,306,168 A | * | 4/1994 | Kunishi et al. ................ 439/248 |
| 5,439,384 A | * | 8/1995 | Thrush et al. ................... 439/69 |
| 5,440,461 A | * | 8/1995 | Nadel et al. ................... 362/103 |
| 5,455,749 A | | 10/1995 | Ferber |
| 5,548,488 A | * | 8/1996 | Hansen ......................... 361/815 |
| 5,567,037 A | | 10/1996 | Ferber |
| 5,823,793 A | * | 10/1998 | Bernardini ..................... 439/68 |
| 5,980,309 A | * | 11/1999 | Frantz et al. .................. 439/500 |
| 5,984,488 A | | 11/1999 | Tung |
| 6,072,619 A | | 6/2000 | Kiryuschev et al. |
| 6,319,015 B1 | * | 11/2001 | Faunce ........................... 439/37 |
| 6,420,008 B1 | | 7/2002 | Lewis et al. |
| 6,474,830 B1 | * | 11/2002 | Hansen ......................... 362/103 |
| 6,478,712 B1 | | 11/2002 | Kawamura et al. |
| 6,579,119 B1 | * | 6/2003 | Wu ............................... 439/500 |
| 6,603,670 B1 | * | 8/2003 | Chien ........................... 361/801 |
| 6,623,293 B1 | * | 9/2003 | Wu ............................... 439/500 |
| 6,642,467 B2 | * | 11/2003 | Farringdon .................... 200/511 |
| 6,676,455 B2 | * | 1/2004 | Machado ....................... 439/855 |
| 6,848,808 B2 | * | 2/2005 | Guerrieri ....................... 362/156 |
| 6,858,796 B1 | | 2/2005 | Garnett et al. |
| 7,186,931 B2 | * | 3/2007 | Chang et al. ................... 200/5 A |
| 7,210,939 B2 | * | 5/2007 | Marmaropoulos et al. ..... 439/37 |
| 7,514,641 B2 | * | 4/2009 | Kohatsu et al. ............. 200/52 R |
| 7,611,255 B1 | * | 11/2009 | Lagassey ....................... 362/103 |
| 2002/0163800 A1 | * | 11/2002 | Hansen .......................... 362/103 |
| 2005/0098421 A1 | | 5/2005 | Kohatsu et al. |
| 2005/0270620 A1 | | 12/2005 | Bauer et al. |

FOREIGN PATENT DOCUMENTS

| | | |
|---|---|---|
| GB | 2396252 A | 6/2004 |
| JP | 2003223121 A | 8/2003 |
| KR | 1020040078031 A | 9/2004 |
| WO | 0067539 A1 | 11/2000 |
| WO | 03095729 A1 | 11/2003 |
| WO | 2004100111 A2 | 11/2004 |
| WO | 2004100113 A2 | 11/2004 |
| WO | 2005067042 A1 | 7/2005 |

OTHER PUBLICATIONS

Paula Gould, Textiles Gain Intelligence, Materialstoday, Oct. 2003, pp. 38-43.

Jaana Hannikainen, et al: Button Component Encasing for Wearable Technology Applications, Proceedings of the 2005 Ninth IEEE International Symposium on Wearable Computers (ISWC'05), IEEE Computer Society, pp. 1-2.

* cited by examiner

SUBMOUNT FOR ELECTRONIC COMPONENTS

TECHNICAL FIELD

The present invention relates to a submount for arranging electronic components on a substrate, and to an arrangement comprising such a submount arranged on a substrate.

TECHNICAL BACKGROUND

Many types of textiles are used in every day life. Simultaneously, the use of electronic equipment in daily life, such as display devices, mobile phones, media players, navigation equipment, and different kinds of sensors increases dramatically.

When electronic equipment is integrated into textiles, new application fields appears, such as textile based display devices, clothes that can tell the present location and point out the direction to a desired location etc.

For ultimate textile integration of electronic components, the interconnecting substrate, e.g. the driving circuitry, should be entirely made of fabrics.

Further, unobtrusive mounting of components onto textile substrates requires the electronic components to be as small as possible and to be widely distributed over the textile substrate in order for the textile to remain its soft and pliable character.

One approach for integrating electrical components into textiles is described in GB 2 396 252 A, describing a textile fabric comprising light-emitting diodes. The textile fabric comprises conductive electrodes, which for example may be woven into the fabric, or printed or embroidered on the fabric. The electrodes and the LEDs together form a matrix-addressable display.

In this patent application, the connectors of the LEDs are attached to the electrodes of the fabric by gluing with an electrically conducting epoxy or by fixing crimp contacts to the electrodes and connecting the LEDs by soldering the LED connectors to the crimp contacts.

However, direct attachment of distributed electronic components, such as LEDs, onto a textile substrate using conductive epoxy is a very delicate and time-consuming process.

Direct soldering of the components onto the textile substrate may often be problematic as well, for example due to the low melting temperature of several textile fibers, such as polyester.

Thus, there is a need in the art for means and methods for arranging electrical components on textile substrates that can be used independent on the nature of the textile fiber, which are well suited for automated arrangement, and which provides a robust attachment of the electronic components on the textile substrate.

SUMMARY OF THE INVENTION

It is an object of the present invention to at least partly meet the need in the art and overcome the problems of the prior art. Thus, one object is to provide a submount for electronic components that can be arranged on a textile substrate to attach electronic components to the substrate and to connect the electronic components to a circuitry comprised in said textile substrate, which submount can be attached to the substrate without the need for soldering or the like.

This object is at least partly met by a submount according to the present invention.

Thus, in a first aspect, the present invention provides a submount for arranging electronic components on a substrate, which comprises a head member having an upper side and a substrate side and at least one substrate-engaging member protruding from the substrate side of said head member. The head member comprises at least two, from each other isolated, electrically conductive portions, which each comprises a component contact, adapted for connection of electronic components thereto, and a substrate contact arranged on said substrate side, adapted for bringing said electrically conductive portions in contact with a circuitry comprised in said substrate.

The head member could for example be in the shape of a ring, a plate or a button, etc. The substrate-engaging member can penetrate into and engage with the substrate, typically textile fibers in a textile substrate, in order to retain the submount in its place such that the substrate side of the head member faces the substrate. By using this engaging action of the substrate-engaging member, the submount may be attached to the substrate without the need for soldering or gluing it to the substrate. The substrate contacts are arranged on the substrate side of the head member. When the submount is arranged on the substrate, it may be arranged such that these substrate contacts are brought into contact with the circuitry of conductive electrodes comprised in the substrate.

In embodiments of the present invention, at least one of the substrate contacts is at least partly constituted by a substrate-engaging member. Thus, the electrical connection and the substrate engagement may be performed by the same physical structure, and the circuitry on the substrate can easily be reached from the submount, even when located on the opposite side of the substrate, due to that the substrate-engaging member is capable of penetrating the substrate.

In embodiments of the present invention, at least one of the substrate-engaging members is essentially pin-shaped. This shape is preferred as such member easily can penetrate a textile substrate.

In embodiments of the present invention, the substrate-engaging member has a length exceeding the thickness of the substrate on which the submount is to be arranged. Such substrate-engaging members can be used to penetrate through the substrate, for example to reach conductive electrodes arranged on the backside of the substrate.

In embodiments of the present invention, at least one of the substrate-engaging members is foldable. A foldable substrate-engaging member may be folded on the backside of the substrate in order to secure the engagement to the substrate and further to clamp an electrode between the substrate-engaging member and the substrate to obtain the electrical connection.

In embodiments of the present invention, the cross-section of the substrate-engaging members, in a plane perpendicular to the main extension thereof, has an oblong shape.

It is advantageous that the substrate-engaging members have an oblong cross-sectional area, as this will assign to the member a preferred direction of folding, i.e. the folding axis will automatically be along the long-axis of the cross-section. This is especially advantageous when the pins are to be folded in an automated process. Further, when the member is used to clamp an electrode, good connection between the electrode and the member is obtained by the increased contact area.

Further, in a submount, the long axis of the oblong cross section of a first substrate-engaging member may form an angle, typically of from 15° to 165° to the long axis of the oblong cross section of a second substrate-engaging member. In certain types of textile substrate, the different types of conductive electrodes (for example cathode electrodes and anode electrodes) are arranged in non-parallel directions, for example perpendicularly. In such cases it is advantageous that each of the oblong substrate-engaging members are arranged such that the elongated direction of their cross-section is essentially parallel to the direction of the corresponding conductive electrode, as this will maximize the contact area between the conductive electrodes and the substrate-engaging means.

In embodiments of the present invention, at least one of the substrate contacts may comprise a portion having a serrated surface. For example, in case conductive electrodes in the substrate is encapsulated in an isolating outer layer, the serrated portion of the substrate contact may penetrate the isolation in order to form an electrical connection with the conductive electrode. One or more electronic components may be connected to the component contacts of the submount, for example selected from the group consisting of light-emitting diodes, integrated circuitry packages, sensors, actuators and semi-conductor components.

In embodiments of the present invention, a portion of the head member may constitute a male member of a snap fastener comprising an engaging protrusion for engaging with an engaging recess of a female member of a snap fastener. Alternatively, a portion of the head member may constitute a female member of a snap fastener comprising an engaging recess for engaging with an engaging protrusion of a male member of a snap fastener.

In such embodiments, the electronic components to be attached to the submount has a suitable shape for snap-fitting on the head member, such that the electronic component constitutes a corresponding male or female member of a snap fastener.

This snap-fastener approach is advantageous since there is no need for soldering or gluing the component to the head-member, and electrical components may easily be replaced when desired.

In embodiments of the present invention, a conductive adhesive material may be arranged on at least one of the substrate contacts.

In order to increase the contact area between the substrate contacts and the conductive electrodes to which the submount is intended to be attached, and to secure the contact, it may be advantageous to arrange a conductive adhesive material on the substrate contacts.

In a second aspect, the present invention relates to an arrangement comprising a textile substrate having a front side and a back side, comprising at least two separate conductive electrodes, and at least one submount of the present invention, wherein at least one substrate-engaging member of said submount penetrates said substrate from the front side thereof, and wherein each of said conductive electrodes is contact with a separate substrate contact of said submount.

In embodiments of the second aspect of the invention, a conductive electrode of the substrate may be clamped between a substrate contact of the submount and the substrate it self, either between the head member and the front side of the substrate, or between a substrate engaging member and the back side of the substrate.

In embodiments of the second aspect of the invention, at least one substrate-engaging member may extend through said substrate to the backside thereof, and a section of the substrate-engaging member, located on the backside, is bended towards the backside surface of the substrate. By fully penetrating the textile substrate with the substrate-engaging means and bending the penetrating section of the member towards the surface of the substrate, the submount is securely attached to the substrate.

Further, when a conductive electrode is arranged on the backside of the substrate, it may be connected to said submount via contact to a section of a substrate-engaging member extending to said backside.

In embodiments of the present invention, isolating layers may be arranged on the conductive electrodes of the substrate in order to isolate adjacent electrodes from each other. In such an arrangement, the isolating layer may be penetrated by a substrate contact, for example by the aforementioned serrated surface of a substrate contact, to form an electrical connection from said conductive electrode to said substrate contact.

BRIEF DESCRIPTION OF THE DRAWINGS

This and other aspects of the present invention will now be described in more detail, with reference to the appended drawings showing a currently preferred embodiment of the invention.

DETAILED DESCRIPTION OF PREFERRED EMBODIMENTS

One aspect of the present invention relates to a submount which may be for attaching electronic components to a substrate, especially to textile or other flexible substrates, where the substrate comprises a circuitry of conducting electrodes which to which circuitry the electronic components should be connected.

As used herein, "electronic components" relate to any electronic component known to those skilled in the art, including, but not limited to, active and passive components, integrated circuits, sensors, actuators, etc. The submount is for example well suited for light emitting diodes. Further, submounts of the present invention may be used for attaching combinations of multiple electronic components The submount of the present invention is especially well suited for electronic components of the type commonly known as "surface mount devices", but also for other types of electronic component packages, and even for so-called "naked die" integrated circuits.

"Textile", as is used herein, refers to material produced by textile fibers, and refers to both knitted, woven and non-woven textile material. Textile fibers include both natural fibers, e.g. wool and cotton, and synthetic fibers, e.g. polyester and nylon.

Typically, a textile substrate suitable for use in the present invention comprises conductive electrodes, such as in the form of conductive yarns, separated by non-conductive yarns. One example is a woven polyester fabric with interwoven or embroidered conductive electrodes. For instance, the conductive electrodes may be constituted by silver-coated polyester fibers. However, any type of textile substrate comprising a circuitry of conductive electrodes is contemplated in the present invention.

Figure 1:
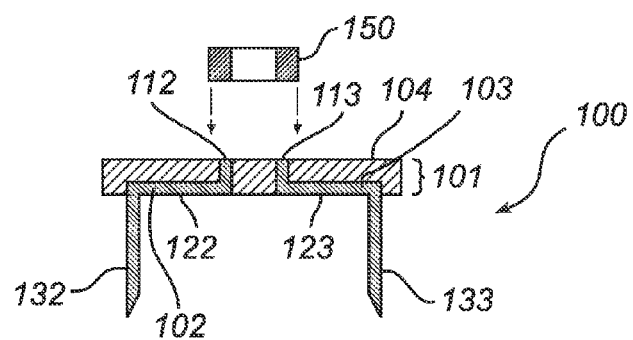
FIG. 1 schematically illustrates a submount of the present invention

An illustrative embodiment of a submount of the present invention is schematically illustrated in FIG. 1. The submount 100 comprises a head member 101 on which an electronic component 150 may be arranged.

The head member 101 comprises two electrically conductive portions 102, 103 that are isolated from each other by means of an isolating material 104.

Each of the electrically conductive portions 102, 103 provide an component contact area 112, 113, respectively, to which contact areas one or more electronic components may be connected. Methods for attaching electronic components 150 to the component contacts 112, 113 include, but are not limited to soldering, gluing with electrically conductive glue, and snapping.

The shape of the head member 101 is illustrated as an essentially flat body, but may take essentially any physical form, such as a flat or dome shaped button, a male or female snap button, a ring, etc.

Further, each of the electrically conductive portions 102 and 103 comprise a substrate contact area 122 and 123 respectively.

The substrate contact areas 122, 123 are arranged on the substrate side of the head member 101, i.e. on the side of the head member that is adapted to face the substrate on which the submount is to be arranged.

The substrate contact areas 122, 123 are arranged in order to form an electrical connection from a circuitry of electrically conductive electrodes, arranged on the substrate on which the submount is to be arranged, to an electronic component 150 arranged on the head member 101 and connected to the component contact areas 112, 113.

Further, substrate-engaging members 132, 133 are arranged on the submount, protruding from the substrate side of the head member 101 for engaging with the substrate, and retaining the submount on the substrate.

The substrate-engaging members 132, 133 should be capable of and suitable for penetrating the substrate and to engage with the substrate materials.

The substrate-engaging members are in this embodiment in the shape of pins extending from the head member.

In the preferred embodiment, the substrate-engaging members 132, 133 are of a foldable material, typically a metal or alloy, and have a length exceeding the thickness of the substrate on which the submount is to be arranged. In such cases, the substrate-engaging members are allowed to penetrate through the substrate such that a section of each member extends out on the backside of the substrate. The penetrating substrate-engaging members are then bended/folded towards the surface of the substrate backside.

By folding/bending the substrate-engaging members on the backside of the substrate, the submount is securely arranged on the substrate.

In the embodiment shown in FIG. 1, the substrate-engaging members 132 and 133 are of an electrically conductive material, typically a conductive metal, such as for example Al, Fe, Au, Ag, Cu, Pb or any conductive alloy, and form part of the substrate contact areas 122 and 123, respectively. Thus, in this embodiment the substrate-engaging members 132, 133 may be used to make electrical contact with the circuitry on the substrate.

Figure 2A:
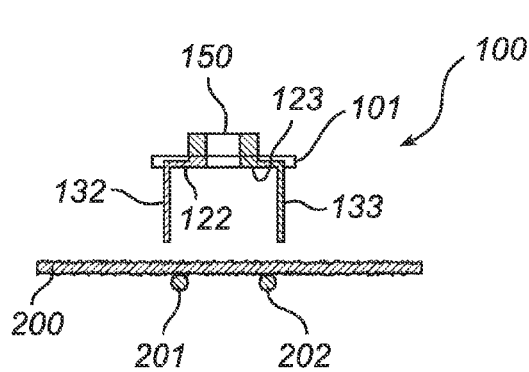
FIG. 2, a to e, illustrates methods for arranging a submount of the present invention on a substrate.
Figure 2B:
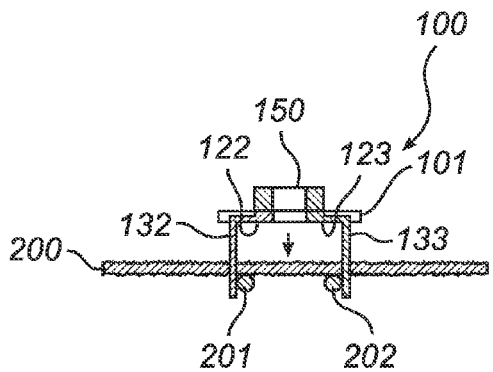
Figure 2C:
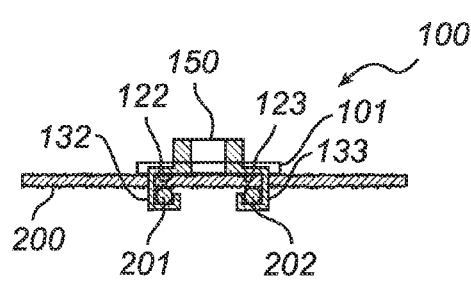

An arrangement of a submount of the present invention on a textile substrate is illustrated in the sequence of FIGS. 2a to 2c. A submount 100 of the above-described embodiment and a textile substrate 200, which comprises a first and a second electrically conductive electrode 201, 202, are provided (FIG. 2a). In this embodiment, the electrically conductive electrodes 201, 202 are arranged on the same side of the textile substrate, namely on the backside in relation to the intended position of the head member of the submount 100.

The substrate-engaging members of the submount 100 are allowed to penetrate the substrate 200 from a front side (the head member side of the substrate) to the opposing backside of the substrate (FIG. 2b).

In order to make contact between the submount 100 and the conductive electrodes 201, 202, the first substrate-engaging member 132 is folded over the first electrode 201, and the second substrate-engaging member 133 is folded over the second electrode 202 (FIG. 2c). Thus, (i) the submount is securely arranged on the textile substrate, and (ii) the electrodes on the substrate are clamped between the substrate and the substrate-engaging means, and thus being brought into electrical contact with the submount.

Figure 2D:
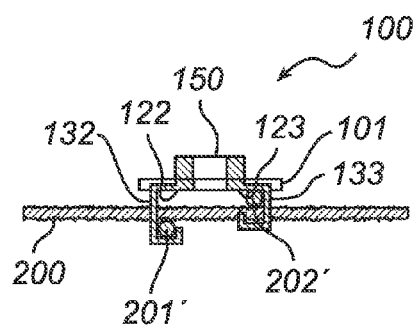

A variant of this embodiment is shown in FIG. 2d, where the first and the second electrically conductive electrodes 201', 202' are arranged on opposite sides of the substrate. In this variant, the first electrode 201' is clamped between the substrate 200 and the substrate-engaging member 132 on the backside of the substrate, whereas the second electrode 202' is clamped between a substrate contact area 123 on the head member 101 and the substrate 200.

Figure 2E:
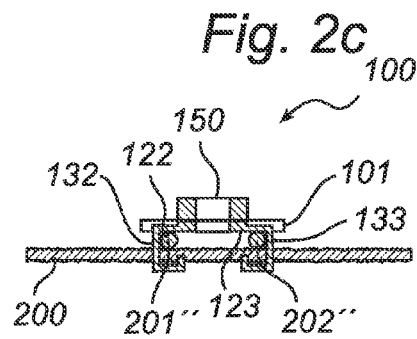

Another variant is shown in FIG. 2e, where the first and the second electrically conductive electrodes 201", 202" are arranged on the front side of the substrate. In this variant, the first electrode 201" is clamped between the substrate 200 and the substrate contact area 122 on the head member 101, and the second electrode 202" is clamped between the substrate 200 and the substrate contact area 123 on the head member 101.

As is apparent from FIG. 2d, the substrate-engaging member 133 is not in contact with any conductive electrode, and it is thus in this embodiment necessary that this substrate-engaging member forms part of the substrate contact area 123.

As is apparent from the FIG. 2e, none of the substrate-engaging members are in contact with any conductive electrodes, and in this embodiment, it is not necessary that any of the substrate-engaging members form part of any substrate contact area.

Figure 3:
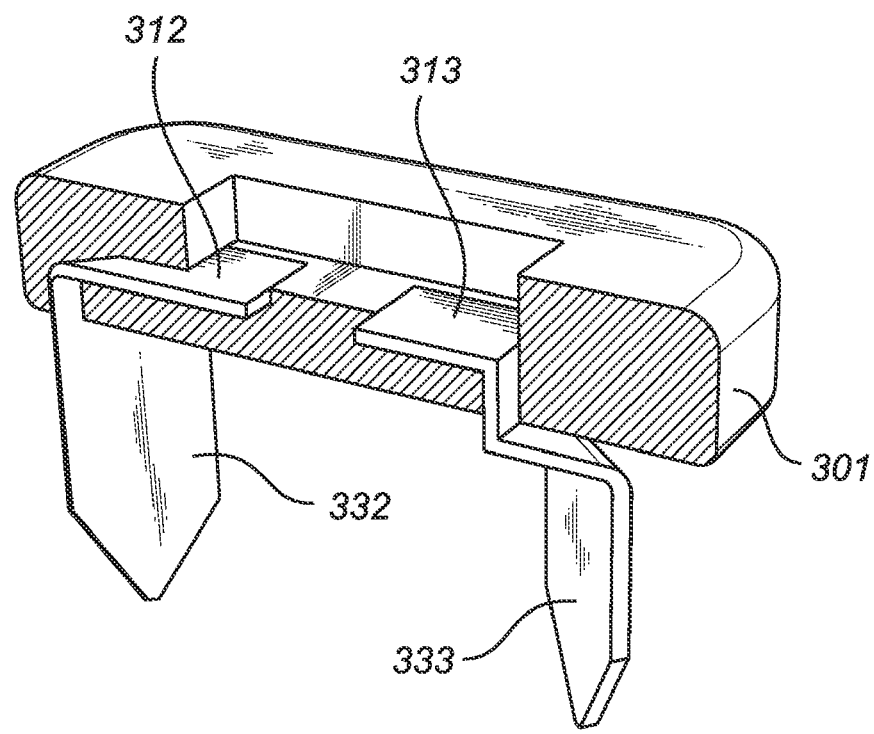
FIG. 3 illustrates a presently preferred embodiment of a submount of the present invention.

In preferred embodiments of a submount of the present invention, such as is illustrated in FIG. 3, the substrate-engaging members 332, 333 are pin-shaped and has an oblong cross-section (crosswise the extension of the member), i.e. the shape of the cross-section has one main dimension of extension (long axis).

The oblong cross-section of the substrate-engaging member assigns a natural folding direction such that the fold is along the long axis of the cross-section. Further, a substrate-engaging member with oblong cross section provides a large contact area to an electrode.

It is preferred that the long side of the cross section of a substrate-engaging member is essentially parallel to the conductive electrode. For example, fabric substrates have been developed where conductive electrodes with different purpose (e.g. anode and cathode electrodes) are arranged non-parallel to each other, e.g. perpendicularly. In a submount for such a substrate it is thus preferred that the substrate-engaging means exhibit a corresponding arrangement, i.e. the long axis of the first substrate-engaging member 332 form an angle to the long axis of the second substrate-engaging member 333.

The head member 301 is mainly formed of an isolating, non-conductive material, such as plastics. The front face of the head member 301 comprises a recess 340 in which component contact areas 312, 313 are located.

Figure 4:
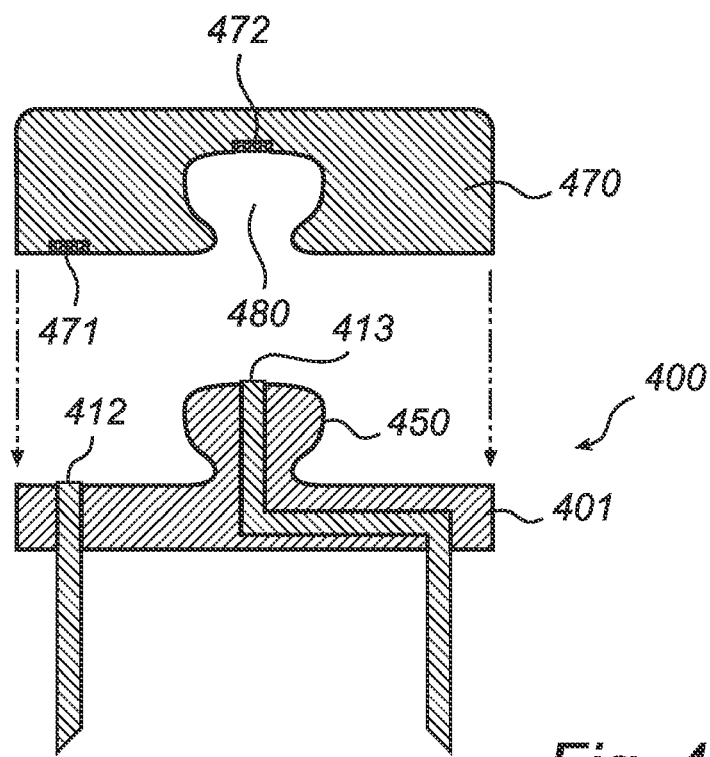
FIG. 4 illustrates another presently preferred embodiment of a submount of the present invention.

In a preferred embodiment, as is illustrated in FIG. 4, the head member 401 of the submount 400 represents a male member of a snap fastener. This submount is especially adapted for being connected to an electronic component 470 having the shape of representing a female member of a snap fastener. The head member 401 comprises an engaging protrusion 450 for engaging with a recess 480 in the electronic component 470.

The first component contact 412 of the head member 401 is arranged on the base surface of the head member 401. The second component contact 413 of the head member 401 is arranged at the top of the protrusion 450.

For connection to this, the electronic component 470 has a first connector 471 arranged on the base surface, and a second connector 472 arranged in the engaging recess 480. Thus, when the electronic component is snap-locked on the submount, the first component contact 412, arranged on the base surface of the head member is contacted to the first connector 471, arranged on the base surface of the electronic device. Further, the second component contact 413, arranged on the engaging protrusion 450, is contacted with the second connector 472 arranged in the engaging recess 480 of the electronic component. The exact design of the engaging recesses and protrusions for obtaining a well working snap-button, as well as materials suitable for this purpose is well known by the person skilled in the art, and is not necessary for understanding the present invention.

Figure 5:
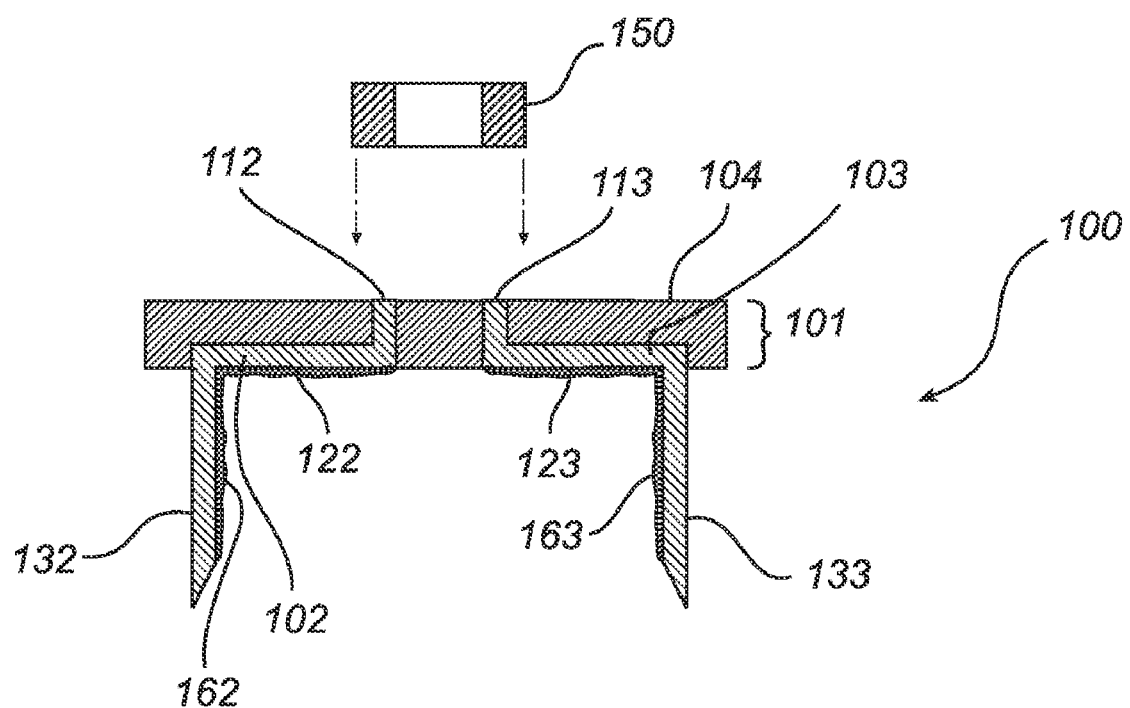
FIG. 5 illustrates another presently preferred embodiment of a submount of the present invention.
Figure 6:
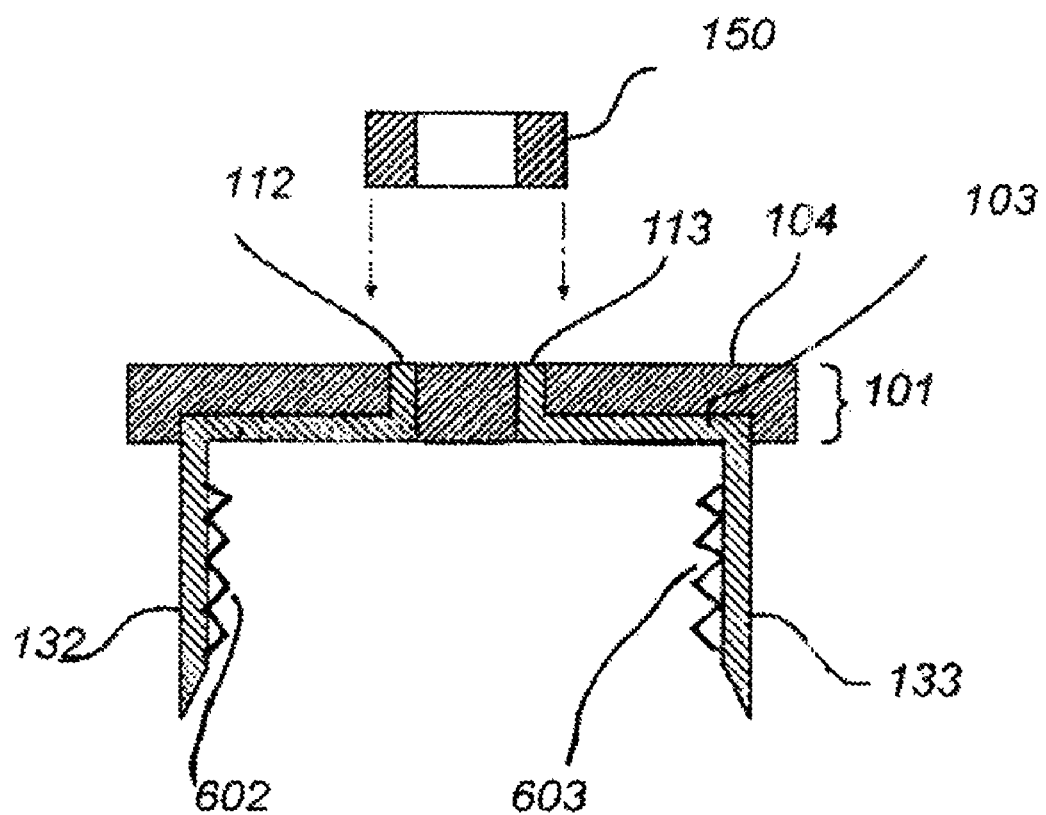
FIG. 6 illustrates another embodiment of the invention in which a portion of at least one of the substrate-engaging members contains a serrated surface.

In yet another embodiment, as illustrated in FIG. 5, a conductive adhesive material 162, 163 is arranged on the substrate contact areas 122, 123.

Though the submount of the present invention function well without the conductive adhesive, there may be large resistive losses due to the mechanical connection to the textile surface. Furthermore, cyclical stresses in the textile may eventually lead to a loosening of the mechanical connection, which can lead to higher resistive losses and a possible break in the electrical connection.

In order to overcome these resistive losses due to poor mechanical connections, a small amount of conductive adhesive is placed on the substrate contacts of the submount. Alternatively, a small amount of adhesive may be placed at the contact points on the textile surface. When the submount is arranged onto the substrate, the mechanical pressure between the submount and the substrate also causes the adhesive to further bond the submount to the textile. This connection not only more securely fastens the submount to the substrate, but also creates a better electrical connection to the conductive electrodes of the substrate as the conductive adhesive seeps into textile surface and creates more electrically conductive paths between the electrodes of the substrate and the substrate contacts of the submount.

Those skilled in the art will realize that it will only be necessary to arrange the conductive adhesive 162, 163 at the location on the substrate contact 122, 123 that will come in contact with the conductors of the substrate. Hence, even though the conductive adhesive in FIG. 5 is illustrated as being distributed over the whole area of the substrate contacts, in reality, only a smaller portion will have to be provided with the adhesive.

Suitable conductive adhesive materials include, but are not limited to, conductive epoxy bases adhesives, such as, but not limited to Loctite 3880 single pot epoxy and Chemance 6500 two pot epoxy, and conductive adhesive tape, such as, but not limited to 3M double sided adhesive copper conducting tape. Other conductive adhesive materials suitable for use in the present invention will be realized by those skilled in the art.

The person skilled in the art will realize that the above embodiment may be modified, for example such that the head member of the submount represents the female member of the snap fastener and the electronic component represents the male member of the snap fastener.

Further, the exact location of the component contacts of the head member as well as the connectors of the electronic component can be modified.

In the embodiments mentioned above, the component contacts are arranged on the upper side of the head member of the submount. It is not the intention that the present invention be limited to this, and in some cases, it can be advantageous to have electronic components attached to the substrate side of the head member. In other cases, it can be advantageous to have electronic components attached to both upper side and substrate side of the head member.

The person skilled in the art realizes that the present invention by no means is limited to the preferred embodiments described above. On the contrary, many modifications and variations are possible within the scope of the appended claims. For example, the head member may comprise more than two, from each other isolated, electrically conductive portions. For example, the head member may comprise three, four or more electrically conductive portions, each conductive portion having a component contact area and a substrate contact area. Consequently, the submount may also comprise more than two substrate-engaging means, e.g. where the substrate engaging members form part of the substrate contact and the head member comprises more than two electrically isolated portions.

A submount of the present invention may be used to connect different types of electronic components to a textile substrate. For example, a single light emitting diode requires two separate connections, the anode and the cathode, whereas other electronic components require more connections, such as a transistor, which requires three separate connections. Alternatively, a plurality of electronic components may be connected to a single submount. For example, a submount providing four separate connections may be used to connect three separate light emitting diodes (three separate cathodes and one common anode).

The head member of a submount of the present invention may further comprise packaged integrated circuits, naked die integrated circuits, passive or active components, optical lenses, heat sinks, sensors and/or batteries.

When the submount of the present invention is to be attached to the substrate, electronic component(s) may already be attached thereon, or may be attached to the submount after it has been attached to the substrate.

The submount may essentially have any shape: However it is preferred that the locations of the substrate contacts are adapted to fit with the locations of the conductive electrodes in the textile substrate.

In order to engage with the substrate material, the substrate-engaging members may be barbed, such that the members may penetrate into the substrate, but where the barbs prevent the members from being pulled out from the substrate.

The conductive electrodes comprised in the substrate may be isolated by an isolating layer arranged on the electrodes. In order for the submount to come in electrical contact with such isolated electrodes, the isolating layer may locally be removed to expose the conductive materials, for example by heating. Alternatively, the substrate contacts may be designed such that they can penetrate the isolating layer in order to contact the conductive electrode. As realized to those skilled in the art, the substrate contacts of the submount may be designed in many ways in order to be able to penetrate the isolating layer. For example, the substrate contacts may have a serrated portion, e.g. having a saw-tooth surface profile, which can pierce the isolating layer of the conductive electrode.

Further, the substrate-engaging members of the submount may further be used to attached additional members to the backside of the substrate, such as by clamping. Examples of such additional members include, but are not limited to, male or female members of a snap fastener, a Velcro® fastener member, etc.

Arrangements of submounts of the present invention arranged on a textile substrate of the present invention may be used for several different purposes. For example, when light-emitting diodes are connected to the submounts, and where the conductive electrodes in the textile form an addressable matrix, the arrangement can form a textile display device, for example to be used on clothes.

To summarize, the present invention provides a submount for arranging electronic components on a substrate. The submount comprises a head member and at least one substrate-engaging member protruding from the head member. The head member comprises at least two, from each other isolated, electrically conductive portions, where each electrically conductive portion comprises a component contact, adapted for connection of electronic components thereto, and a substrate contact on arranged on said substrate side, adapted for bringing said electrically conductive portions in contact with a circuitry comprised in said substrate.

The submount of the present invention may be used to attach electronic components, such as light-emitting diodes, to a textile substrate, without the need for soldering the electronic component directly on the substrate.

The invention claimed is:

1. A submount for arranging electronic components on a substrate, comprising a head member having an upper side and a substrate side and at least one substrate-engaging member protruding from the substrate side of said head member, wherein said head member comprises at least two, from each other isolated, electrically conductive portions, each electrically conductive portion comprising a component contact for connection of electronic components thereto, and a substrate contact arranged on said substrate side for bringing said electrically conductive portions in contact with a circuitry comprised in said substrate;
    wherein the cross-section of said substrate-engaging member, in a plane perpendicular to the main extension of said substrate engaging member, has an oblong shape.

2. A submount according to claim 1, wherein at least one of said substrate contacts is at least partly constituted by a substrate-engaging member.

3. A submount according to claim 1, wherein said at least one substrate-engaging member is essentially pin-shaped.

4. A submount according to claim 1, wherein said substrate-engaging member has a length exceeding the thickness of the substrate.

5. A submount according to claim 1, wherein at least one substrate-engaging member is foldable.

6. A submount according to claim 5, comprising at least a first substrate engaging member and a second substrate-engaging member, wherein the long axis of the oblong cross section of said first substrate-engaging member forms an angle of from 15° to 165° to the long axis of the oblong cross section of said second substrate-engaging member.

7. A submount according to claim 1, wherein at least one of said substrate-engaging members comprises a portion having a serrated surface.

8. A submount according to claim 1, wherein at least one electronic component is connected to said component contacts.

9. A submount according to claim 1, wherein said at least one electronic component is selected from the group consisting of light-emitting diodes, integrated circuitry packages, sensors, actuators and semi-conductor components.

10. A submount for arranging electronic components on a substrate, comprising a head member having an upper side and a substrate side and at least one substrate-engaging member protruding from the substrate side of said head member, wherein said head member comprises at least two, from each other isolated, electrically conductive portions, each electrically conductive portion comprising a component contact for connection of electronic components thereto, and a substrate contact arranged on said substrate side for bringing said electrically conductive portions in contact with a circuitry comprised in said substrate;
    wherein a portion of said head member constitutes a male member of a snap fastener comprising an engaging protrusion for engaging with an engaging recess of an female member of a snap fastener.

11. A submount according to claim 10, wherein an electronic component, constituting said female member of a snap fastener comprising an engaging recess, is snap-locked on said engaging protrusion.

12. A submount for arranging electronic components on a substrate, comprising a head member having an upper side and a substrate side and at least one substrate-engaging member protruding from the substrate side of said head member, wherein said head member comprises at least two, from each other isolated, electrically conductive portions, each electrically conductive portion comprising a component contact for connection of electronic components thereto, and a substrate contact arranged on said substrate side for bringing said electrically conductive portions in contact with a circuitry comprised in said substrate;
    wherein a portion of said head member constitutes a female member of a snap fastener comprising an engaging recess for engaging with an engaging protrusion of an male member of a snap fastener.

13. A submount according to claim 12, wherein an electronic component, constituting said male member of a snap fastener, is snap-locked on said head member engaging recess.

14. A submount for arranging electronic components on a substrate, comprising a head member having an upper side and a substrate side and at least one substrate-engaging member protruding from the substrate side of said head member, wherein said head member comprises at least two, from each other isolated, electrically conductive portions, each electrically conductive portion comprising a component contact for connection of electronic components thereto, and a substrate contact arranged on said substrate side for bringing said electrically conductive portions in contact with a circuitry comprised in said substrate
    wherein a conductive adhesive material is arranged on at least one of said substrate contacts.

15. A submount according to claim 14, wherein said conductive adhesive material comprises a conductive epoxy material or an conductive adhesive tape.

16. An arrangement comprising:
    a textile substrate having a front side and a back side and comprising at least two separate conductive electrodes, and
    at least one submount, said submount comprising a head member having an upper side and a substrate side and at least one substrate-engaging member protruding from the substrate side of said head member, wherein said head member comprises at least two, from each other isolated, electrically conductive portions, each electrically conductive portion comprising a component contact for connection of electronic components thereto, and a substrate contact arranged on said substrate side for bringing said electrically conductive portions in contact with a circuitry comprised in said substrate;

wherein said at least one substrate-engaging member of said submount penetrates said substrate from the front side thereof, and wherein each of said conductive electrodes is in contact with a separate substrate contact of said submount.

17. An arrangement according to claim 16, wherein said conductive electrodes are clamped between said substrate contacts and said substrate.

18. An arrangement according to claim 16, wherein a conductive adhesive material bonds at least one of said substrate contact to one of said conductive electrodes.

19. An arrangement according to claim 16, wherein at least one substrate-engaging member extends through said substrate to the backside thereof, and wherein a section of said substrate-engaging member located on said backside is bent towards the backside surface of the substrate.

20. An arrangement according to claim 16, wherein at least one of said conductive electrodes is arranged on the backside of the substrate, and is connected to said submount via contact to a section of a substrate-engaging member extending to said backside.

21. An arrangement according to claim 16, wherein said conductive electrode arranged on the backside of said substrate is clamped between said substrate and said substrate-engaging member.

22. An arrangement according to claim 16, wherein an isolating layer, arranged to isolate a conductive electrode, is penetrated by a substrate contact to form an electrical connection from said conductive electrode to said substrate contact.

23. An arrangement according to claim 16, wherein a female or male member of a snap fastener is arranged on the backside of said substrate and retained by engagement with said substrate engaging means.

\* \* \* \* \*